United States Patent [19]

Shimada

[11] 4,367,538

[45] Jan. 4, 1983

[54] SEMICONDUCTOR MEMORY DEVICE

[75] Inventor: Hiroshi Shimada, Tokyo, Japan

[73] Assignee: Fujitsu Limited, Kawasaki, Japan

[21] Appl. No.: 236,619

[22] Filed: Feb. 20, 1981

[30] Foreign Application Priority Data

Feb. 22, 1980 [JP] Japan .................................. 55/21427

[51] Int. Cl.³ .............................................. G11C 11/40
[52] U.S. Cl. .................................... 365/109; 365/104; 365/230
[58] Field of Search ................ 365/174, 104, 189, 230

[56] References Cited

U.S. PATENT DOCUMENTS 4,327,424 4/1982 Wu ........................................ 365/104

Primary Examiner—Terrell W. Fears
Attorney, Agent, or Firm—Staas & Halsey

[57] ABSTRACT

A semiconductor memory device of an MOS static type comprising a current switching mechanism, such as depletion type transistors, arranged between a power supply and bit lines. The current switching mechanism is controlled by column selection signals and supplied a larger current to the bit lines during the selected mode than the non-selected mode.

5 Claims, 3 Drawing Figures

SEMICONDUCTOR MEMORY DEVICE

BACKGROUND OF THE INVENTION

The present invention relates to a semiconductor memory device and, more particularly, to a semiconductor memory device incorporating MOS static RAM cells.

In general, each of the MOS static memory cells comprises a bistable flip-flop circuit which uses four or six transistors per bit. That is, the memory cell comprises a pair of driver transistors which are cross-coupled to each other, a pair of load resistors or load transistors, and a pair of transfer transistors connected to one word line and to one pair of bit lines. In this memory cell, only one of the driver transistors is turned on to correspond to memory data "1" or "0".

In order to read the cell, the transfer transistors are turned on by changing the potential of the word line and the data on the driver transistors is transferred to the bit lines. On the other hand, writing is achieved by also turning on the transfer transistors and then applying the proper voltage to the bit lines.

One conventional semiconductor memory device of a MOS static type incorporates a large number of such memory cells arranged along rows and columns which are orthogonal to each other. In addition, the device comprises a plurality of word lines each connected to the memory cells belonging to one corresponding row, a plurality of pairs of bit lines, each pair connected to the memory cells belonging to one corresponding column, a plurality of pairs of load transistors, each pair connected to one corresponding pair of the bit lines, and a plurality of pairs of bit drivers, each pair connected to one corresponding pair of the bit lines. In this case, selection of one cell among the memory cells is effected by selecting one of the word lines and one pair of the bit lines.

However, in the above-mentioned conventional device, when one memory cell is selected so as to read the data stored in the cell, transfer transistors of other non-selected memory cells belonging to the same word line of the selected cell are also turned on, so that currents flow from a power supply through the non-selected memory cells to another power supply (ground). Therefore, since a large number of non-selected memory cells are connected to one selected word line, power dissipation therefor is high.

SUMMARY OF THE INVENTION

It is the principal object of the present invention to provide a semiconductor memory device incorporating MOS static memory cells with low power dissipation.

According to the present invention, there is provided a semiconductor memory device comprising: a first power supply; a plurality of word lines; a plurality of word drivers, each connected to a corresponding one of the word lines; a plurality of pairs of bit lines connected to the first power supply; a plurality of pairs of load MOS transistors connected between the first power supply and each of the pairs of bit lines; a plurality of pairs of bit drivers, each pair connected to one of the pairs of bit lines, and controlled by column selection signals; a plurality of memory cells of an MOS static type, each connected to one of the word lines and to one of the pairs of bit lines; and current switching means, connected between the first power supply and each of the pairs of bit lines and controlled by the column selection signals, for supplying a larger current to the pairs of bit lines during the selected mode than the non-selected mode.

BRIEF DESCRIPTION OF THE DRAWINGS

The present invention will now be more clearly understood from the following description contrasted with the conventional device and with reference to the drawings, wherein.

DESCRIPTION OF THE PREFERRED EMBODIMENTS

Figure 1:
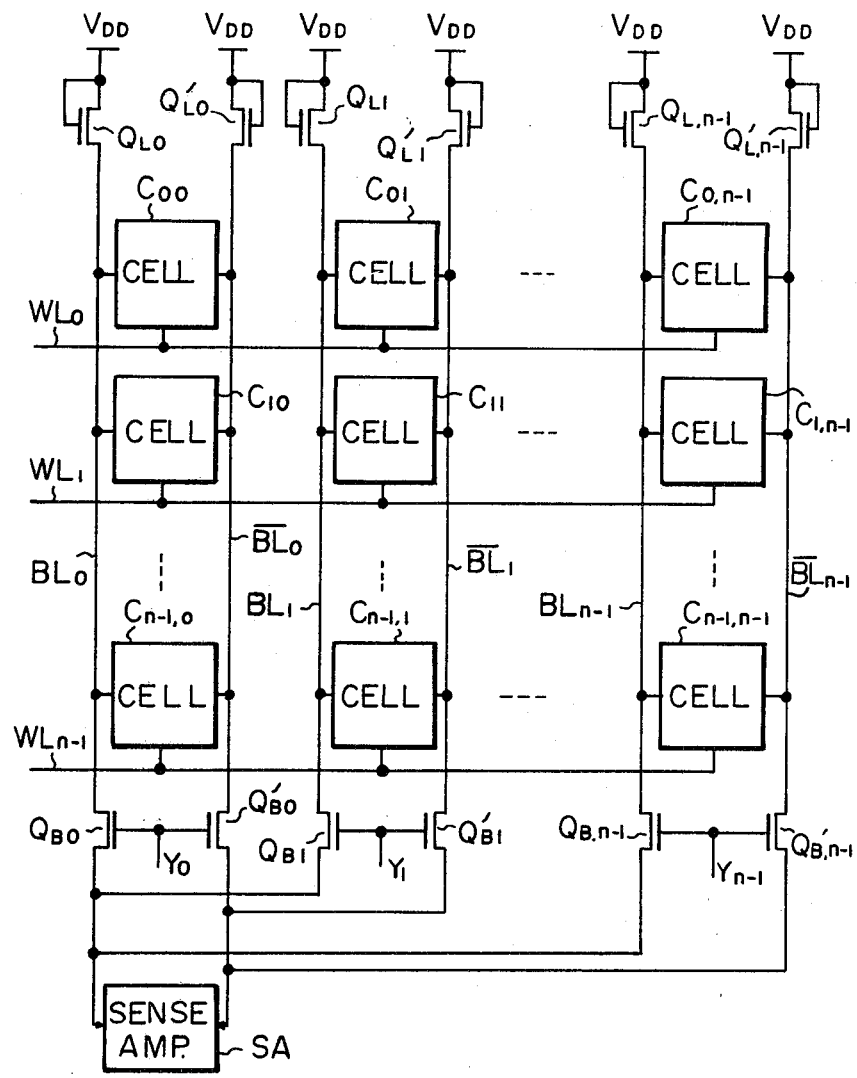
FIG. 1 is a block circuit diagram illustrating one conventional semiconductor memory device.

In FIG. 1, which illustrates one conventional semiconductor memory device, a memory device comprises a plurality of memory cells $C_{ij}$ (i, j=0, 1, ..., n−1) which are arranged in an n row, n column matrix. Each of the memory cells, for example, the memory cell $C_{00}$, is connected to one word line $WL_0$ which is selected by a word driver (not shown) and to one pair of bit lines $BL_0$ and $\overline{BL}_0$ which are selected by transistors $Q_{B0}$ and $Q_{B0}'$. In this device the transistors $Q_{B0}$ and $Q_{B0}'$ are column selecting gates which are controlled by a column selection signal $Y_0$. In addition, all the bit lines $BL_0$, $\overline{BL}_0$, $BL_1$, $\overline{BL}_1$, ..., $BL_{n-1}$, $\overline{BL}_{n-1}$ are connected to a power supply $V_{DD}$ through load transistors $Q_{L0}$, $Q_{L0}'$, $Q_{L1}$, $Q_{L1}'$, ..., $Q_{L,n-1}$, $Q_{L,n-1}'$, respectively, and to a sense amplifier SA through the transistors $Q_{B0}$, $Q_{B0}'$, $Q_{B1}$, $Q_{B1}'$, ..., $Q_{B,n-1}$, $Q_{B,n-1}'$, respectively.

Figure 2:
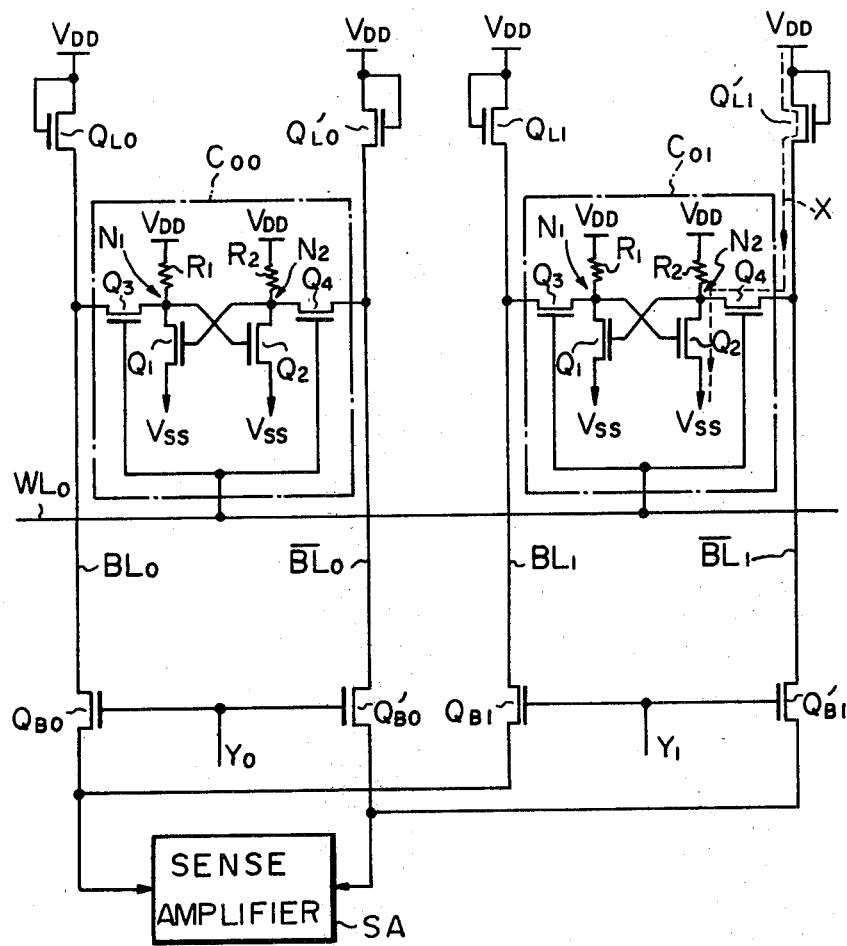
FIG. 2 is a circuit diagram of the memory cells $C_{00}$ and $C_{01}$ of FIG. 1.

FIG. 2 is a circuit diagram of the memory cells $C_{00}$ and $C_{01}$ of FIG. 1. In FIG. 2, each of the memory cells $C_{00}$ and $C_{01}$, which are, of course, the same as the other memory cells of FIG. 1, comprises a pair of transistors $Q_1$ and $Q_2$ cross-coupled to each other, a pair of load resistors $R_1$ and $R_2$, and a pair of transfer transistors $Q_3$ and $Q_4$. In this case, a drain and a gate of the transistor $Q_1$ are connected to a gate and a drain of the transistor $Q_2$, respectively. In addition, the transfer transistors $Q_3$ and $Q_4$ are connected to the bit lines $BL_0$ and $\overline{BL}_0$, respectively, and the gates of the transistors $Q_3$ and $Q_4$ are connected to the word line $WL_0$, commonly. In FIG. 2, it should be noted that two gate-drain connected transistors can be used as the load resistors $R_1$ and $R_2$.

The write operation for such a memory cell is effected by forcing the potentials as nodes $N_1$ and $N_2$ to be high and low, respectively, or vice versa. For example, in the memory cell $C_{00}$, when the potentials at the nodes $N_1$ and $N_2$ are forced to be high and low, respectively, the transistors $Q_1$ and $Q_2$ remain in the conductive and non-conductive states, respectively.

Next, the read operation for such a memory cell will now be explained. For example, when the data stored in the memory cell $C_{00}$ is read out, the potential of the word line $WL_0$ is forced to be high by a word driver (not shown), so that the transfer transistors $Q_3$ and $Q_4$ of the cell $C_{00}$ conduct. As a result, the potentials at the nodes $N_1$ and $N_2$ of the cell $C_{00}$, which potentials are dependent upon the memory data "1" or "0" are transmitted to the bit lines $BL_0$ and $\overline{BL}_0$, respectively. In addition, in this case, the potential of the column selection signal $Y_0$ is forced to be high, so that the transistors $Q_{B0}$ and $Q_{B0}'$ are conductive. Therefore, the difference in potential between the bit lines $BL_0$ and $\overline{BL}_0$ is amplified by the sense amplifier SA.

However, in this state, even in the memory cell $C_{01}$, the transfer transistors $Q_3$ $Q_4$ become in the conductive state, since the potential of the word line $WL_0$ is high. As a result, as illustrated by a dotted line X, a current flows from the power supply $V_{DD}$, through the transistor $Q_{L1}'$, the bit line $\overline{BL}_1$, the transistors $Q_4$ and $Q_2$ of the cell $C_{01}$, to the ground $V_{SS}$, if the potentials at the nodes $N_1$ and $N_2$ are high and low, respectively. In other words, when the potential of one word line is high, the same type of a current flows through each of the other non-selected memory cells which belong to said word line.

Returning to FIG. 1, usually, the semiconductor device is of a large scale, which is for example, 4,096 or 16,384 bits. Therefore, in the case of a 16,384 bit ($256 \times 256$) memory device, such a current flows through each of 225 non-selected memory cells belonging to one word line. This results in a high power consumption.

Figure 3:
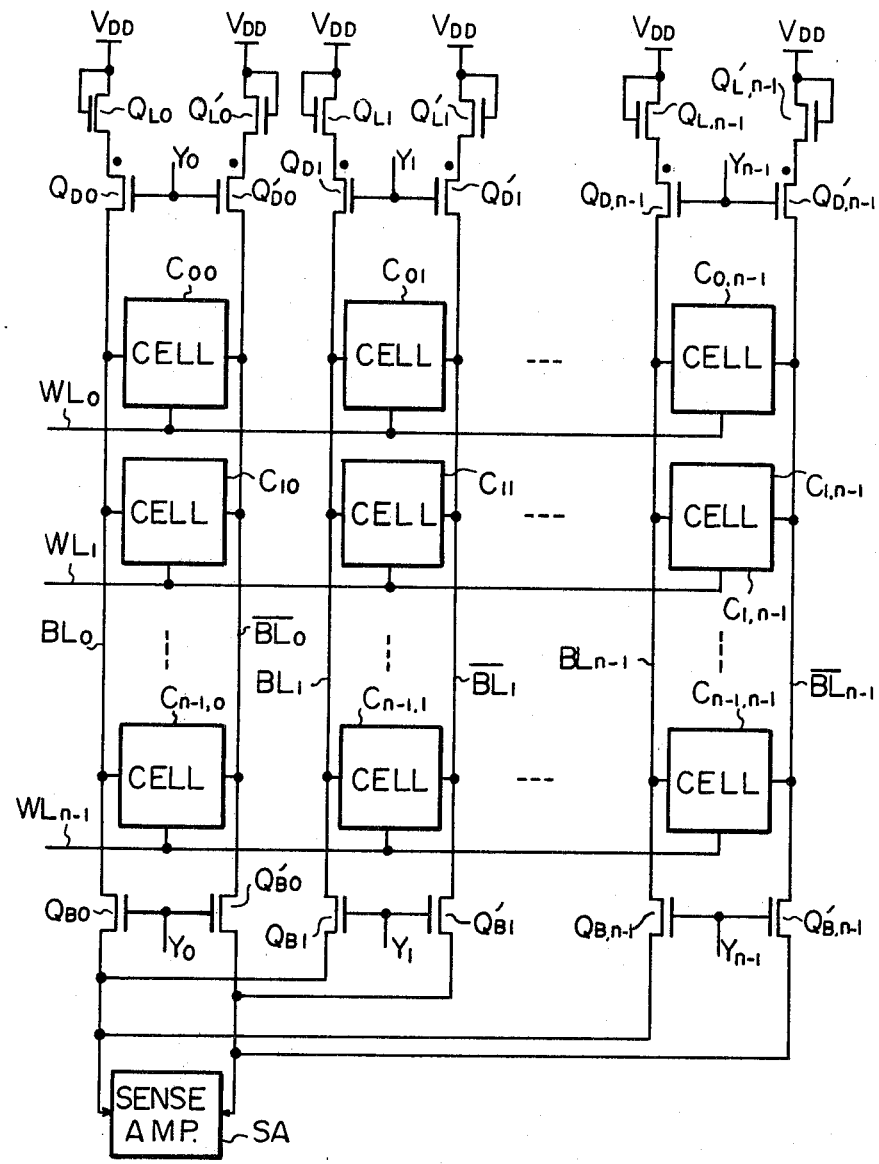
FIG. 3 is a block diagram illustrating an embodiment of the semiconductor memory device according to the present invention.

FIG. 3 is a block circuit diagram illustrating an embodiment of the semiconductor memory device according to the present invention. In FIG. 3, the elements which are the same as those of FIG. 1 are denoted by the same reference numerals. In FIG. 3, transistors $Q_{D0}$, $Q_{D0}'$, $Q_{D1}$, $Q_{D1}'$, ..., $Q_{D,n-1}$, $Q_{D,n-1}'$ which serve as current switching means are arranged between the power supply $V_{DD}$ and each of the bit lines. It should be noted that the transistors $Q_{D0}$, $Q_{D0}'$, $Q_{D1}$, $Q_{D1}'$, ..., $Q_{D,n-1}$, $Q_{D,n-1}'$ are of a depletion type. The depletion type transistors can not be turned off, even when the gate potentials thereof are low. In other words, the depletion type transistors remain in the conductive state, regardless of the gate potentials. However, in this case, the conductances of the depletion type transistors are changed corresponding to the gate potentials which are determined by the column selection signals $Y_0$, $Y_1$, ..., $Y_{n-1}$.

Therefore, when the memory cell $C_{00}$ is selected, that is, when the potentials of the word line $WL_0$ and the column selection signal $Y_0$ are high and the potentials of the other word lines and the other column selection signals are low, the currents flowing from the power supply $V_{DD}$ to the non-selected memory cells $C_{01}$, ..., $C_{0,n-1}$ are reduced as compared with the current flowing from the selected memory cell $C_{00}$. This is because the conductances of the transistors $Q_{D1}$ and $Q_{D1}'$, ..., $Q_{D,n-1}$ and $Q_{D,n-1}'$ are smaller than those of the transistors $Q_{D0}$ and $Q_{D0}'$.

In the above-mentioned embodiment, instead of the depletion type transistors $Q_{D0}$, $Q_{D0}'$, $Q_{D1}$, $Q_{D1}'$, ..., $Q_{D,n-1}$, $Q_{D,n-1}'$, enhancement type transistors may be used. However, in this case, the following problem occurs. When the memory cell $C_{00}$ is selected, the transistors $Q_{B1}$, $Q_{B1}'$, ..., $Q_{B,n-1}$, $Q_{B,n-1}'$ and the transistors $Q_{D1}$, $Q_{D1}'$, ..., $Q_{D,n-1}$, $Q_{D,n-1}'$ are nonconductive so that the bit lines $BL_1$, $\overline{BL}_1$, ..., $BL_{n-1}$, $\overline{BL}_{n-1}$ are in a floating state, which invites malfunction and low operation speed.

As explained hereinbefore, the semiconductor device according to the present invention has an advantage in that power dissipation is reduced as compared with the conventional device, since the amount of current flowing from the power supply to non-selected memory cells belonging to a selected word line is reduced.

I claim:

1. A semiconductor memory device comprising:
    a first power supply;
    a plurality of word lines;
    a plurality of pairs of bit lines forming columns and being connected to said first power supply;
    a plurality of pairs of load means, each load means pair being connected between said first power supply and corresponding pairs of bit lines;
    a plurality of pairs of column selecting gates, for receiving column selection signals, each gate pair connected to a corresponding one of said pairs of bit lines and controlled by a column selection signal;
    a plurality of memory cells of a static memory type, each memory cell connected to a corresponding one of said word lines and to a corresponding one of said pairs of bit lines; and
    current switching means, connected between said first power supply and each of said pairs of bit lines and controlled according to said column selection signals, for supplying a larger current to a selected one of said pairs of bit lines than other pairs of bit lines which are not selected.

2. A device as set forth in claim 1, wherein said current switching means comprises a plurality of pairs of MOS transistors of a depletion type, each MOS transistor pair being controlled according to a corresponding one of said column selection signals.

3. A device as set forth in claim 1, wherein each of said memory cells of a static memory type comprises:
    first and second MOS transistors, each having a gate connected to a drain of the other, and a source connected to a second power supply;
    third and fourth MOS transistors, each having a drain connected to one of said bit lines associated with said memory cell, a source connected to one of the drains of said first and second MOS transistors, and a gate connected to said work line associated with said memory cell; and
    a pair of load resistors, each resistor being connected between said first power supply and one of the drains of said first and second MOS transistors.

4. A device as set forth in claim 1, wherein each of said memory cells of a static memory type comprises:
    first and second MOS transistors, each having a gate connected to a drain of the other, and a source connected to a second power supply;
    third and fourth MOS transistors, each having a drain connected to one of said bit lines associated with said memory cell, a source connected to one of the drains of said first and second MOS transistors, and a gate connected to said word line associated with said memory cell; and
    fifth and sixth MOS transistors, each having a drain connected to a gate thereof and to said first power supply, and a source connected to one of the drains of said first and second transistors.

5. A device as set forth in claim 1, wherein said current switching means comprises a plurality of pairs of MOS transistors of an enhancement type, each MOS transistor pair being controlled according to a corresponding one of said column selection signals.

* * * * *

UNITED STATES PATENT AND TRADEMARK OFFICE
CERTIFICATE OF CORRECTION

PATENT NO. : 4,367,538
DATED : January 4, 1983
INVENTOR(S) : Shimada

It is certified that error appears in the above-identified patent and that said Letters Patent is hereby corrected as shown below:

Col. 2, line 28, "$Q_{B0}$ and $QB0'$" should be --$Q_{B0}$ and $Q_{B0}'$--;

Col. 2, line 66, after " "0" " insert --,--.

Col. 3, line 6, "$Q_3Q_4$" should be --$Q_3$ and $Q_4$--.

Col. 4, line 41, "work" should be --word--.

Signed and Sealed this

Seventeenth Day of May 1983

[SEAL]

Attest:

DONALD J. QUIGG

Attesting Officer  Acting Commissioner of Patents and Trademarks